United States Patent [19]

Park et al.

[11] Patent Number: 5,436,500
[45] Date of Patent: Jul. 25, 1995

[54] SURFACE MOUNT SEMICONDUCTOR PACKAGE

[75] Inventors: Jong Y. Park, Bucheon; Jong K. Choi, Incheon, both of Rep. of Korea

[73] Assignee: Samsung Electronics Co., Ltd., Suwon, Rep. of Korea

[21] Appl. No.: 994,425

[22] Filed: Dec. 21, 1992

[30] Foreign Application Priority Data

Dec. 24, 1991 [KR] Rep. of Korea .................. 91-24131

[51] Int. Cl.⁶ .................. H01L 23/48; H01L 23/02; H01L 29/44
[52] U.S. Cl. .................. 257/696; 257/692; 257/693; 257/675; 257/735; 257/773; 257/782; 361/760; 361/767; 361/772
[58] Field of Search .................. 257/690, 692, 696, 735, 257/676, 666, 679, 668, 675, 693, 773, 782, 783, 784; 361/760, 767, 772

[56] References Cited

U.S. PATENT DOCUMENTS

| | | | |
|---|---|---|---|
| 3,940,786 | 2/1976 | Scheingold et al. | 257/696 |
| 4,539,472 | 9/1985 | Poetker et al. | 257/679 |
| 4,937,656 | 6/1990 | Kohara | 257/676 |
| 5,157,480 | 10/1992 | McShane et al. | 257/696 |
| 5,224,021 | 6/1993 | Takada et al. | 257/692 |

Primary Examiner—Rolf Hille
Assistant Examiner—Valencia Wallace
Attorney, Agent, or Firm—Robert A. Westerlund; Stephen R. Whitt; Charles R. Donohoe

[57] ABSTRACT

A surface mount semiconductor package having a novel lead configuration which facilitates a higher packing density than presently available semiconductor packages. More particularly, the package includes a plurality of electrical leads each having a laterally outwardly extending portion, a downwardly extending portion depending from an inner distal end of the laterally extending portion, and a foot portion extending laterally inwardly from a lower distal end of the downwardly extending portion. A semiconductor chip is mounted, preferably by adhesive means such as insulating tape, to the foot portion of the leads. A plurality of electrical wires are connected between an upper surface of the chip and the laterally outwardly extending portion of respective ones of the leads. A protective body, such as a molded resin body, encapsulates the chip, the wires, the laterally outwardly and downwardly extending portions of the leads. The foot portion of each of the leads is at least partially disposed externally to the molded resin body to facilitate the mounting of the package to a printed circuit board (PCB) or other substrate.

42 Claims, 2 Drawing Sheets

SURFACE MOUNT SEMICONDUCTOR PACKAGE

BACKGROUND OF THE INVENTION

The present invention relates generally to semiconductor packages, and more particularly, to a surface mount semiconductor package having a novel lead configuration which facilitates a higher packing density than presently available semiconductor packages.

With reference now to FIG. 1, a conventional semiconductor package will now be described. More particularly, the conventional semiconductor package 7 includes a semiconductor chip 2 mounted on a leadframe pad 1. Electrical wires 4 are connected between chip bonding pads 2a and corresponding metal leads 9. The chip 2, the leadframe pad 1, and the wires 4 are fully encapsulated within a molded plastic body 5. The leads 9 are supported by means of internal portions 3 thereof which are fixed within the plastic body 5 at a location adjacent to the chip 2. The leads 9 each have an external portion 6 which is bent downwardly and outwardly to facilitate mounting of the package 7 to a printed circuit board (PCB) 8, e.g., by means of soldering.

Although the above-described conventional semiconductor package 7 has a relatively small footprint, the need for packages having even smaller footprints has arisen, in order to facilitate even higher packing densities of these components on PCBs. In this regard, the conventional semiconductor package 7 requires a mounting area on the upper surface of the PCB 8 which is greater than the outline (i.e., the width X length = surface area) of the molded plastic body 5, because the leads 9 have external portions 6 which extend laterally outwardly beyond the periphery of the plastic body 5. Thus, the lateral distance by which the external portions 6 of the leads 9 extend outwardly beyond the periphery of the plastic body 5 imposes a lower limit on the mounting area required for mounting the package 7 to the PCB 8. It is a primary object of the present invention to overcome this limitation.

SUMMARY OF THE INVENTION

The present invention encompasses a surface mount semiconductor package having a novel lead configuration which facilitates a higher packing density than presently available semiconductor packages. More particularly, the package includes a plurality of electrical leads each having a laterally outwardly extending portion, a downwardly extending portion depending from an inner distal end of the laterally extending portion, and a foot portion extending laterally inwardly from a lower distal end of the downwardly extending portion. A semiconductor chip is mounted, preferably by adhesive means such as insulating tape, to the foot portion of the leads. A plurality of electrical wires are connected between an upper surface of the chip and the laterally outwardly extending portion of respective ones of the leads. A protective body, such as a molded resin body, encapsulates the chip, the wires, the laterally outwardly and downwardly extending portions of the leads. The foot portion of each of the leads is at least partially disposed externally to the molded resin body to facilitate the mounting of the package to a printed circuit board (PCB) or other substrate. In one embodiment, each of the leads further has an alternative mounting portion extending upwardly and outwardly from an outer distal end of the laterally outwardly extending portion, with the alternative mounting portion being at least partially disposed externally of the body for facilitating the mounting of the package to the PCB. With this embodiment, the package has the versatility of being mounted to the PCB by means of the foot portion or the alternative mounting portion of the leads being secured, e.g., soldered, to the upper surface of the PCB. In another embodiment, the leads are not provided with the alternative mounting portion, thereby reducing the mounting area required for mounting the package to the PCB. More particularly, with this embodiment, the required mounting area is no greater than the outline of the molded resin body, due to the fact that the leads are not provided with any external portion which extends laterally outwardly beyond the periphery of the body.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
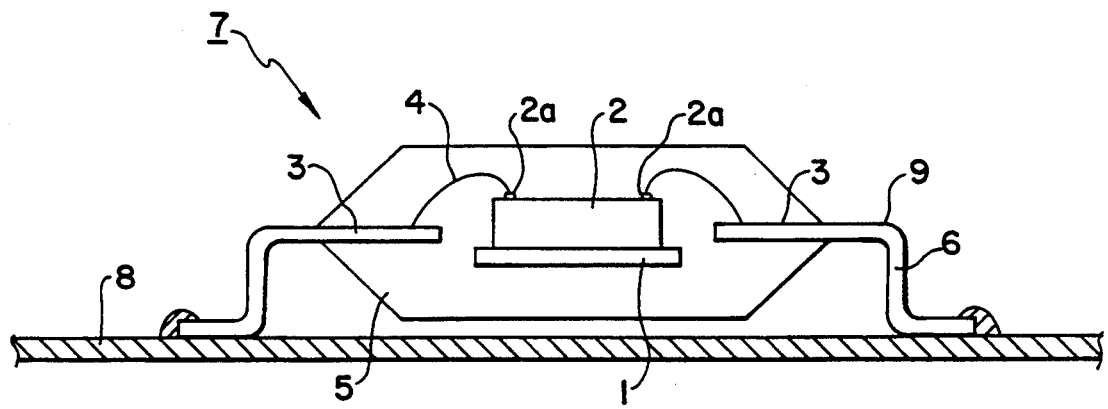
FIG. 1 is a cross-sectional view of a conventional surface mount semiconductor package.
Figure 2:
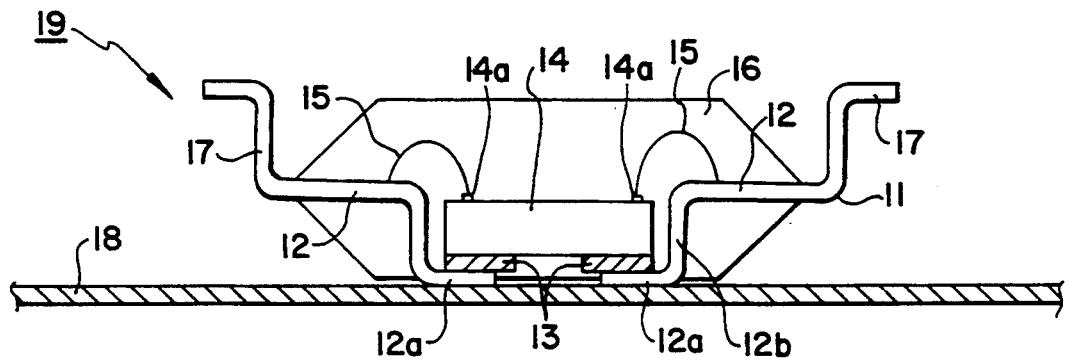
FIG. 2 is a cross-sectional view of a surface mount semiconductor package constituting a first preferred embodiment of the present invention, illustrating a first mounting configuration in which the chip housed by the package is oriented right side up.
Figure 3:
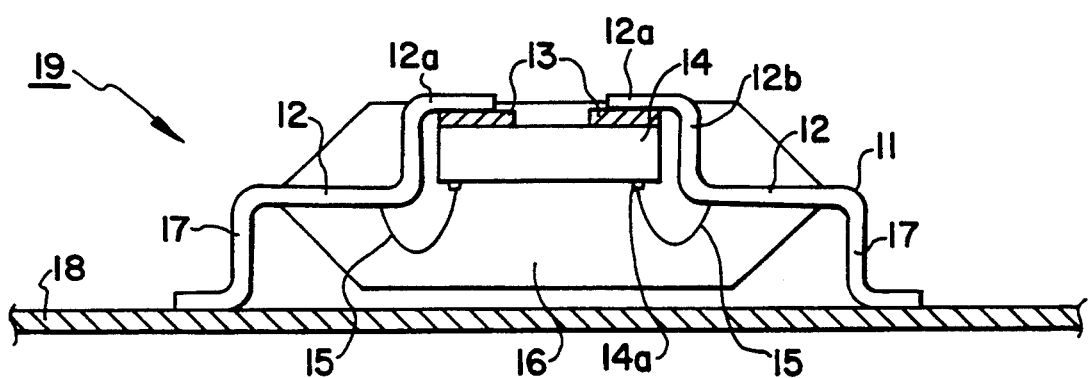
FIG. 3 is a cross-sectional view of the package depicted in FIG. 2, but illustrating a second mounting configuration in which the chip housed by the package is oriented right side down (i.e., inverted from the position shown in FIG. 2)

With reference now to FIGS. 2 and 3, there can be seen a semiconductor package 19 constituting a first preferred embodiment of the present invention. More particularly, the semiconductor package 19 includes a semiconductor chip 14 mounted to opposed, inwardly directed foot portions 12a of leads 11, which are electrically connected by means of electrical wires 15 to corresponding chip bonding pads 14a disposed along opposite marginal edges of the upper surface of the chip 14. The chip 14 is preferably adhesively secured to the foot portions 12a of the leads 11 by means of respective strips of insulating tape 13. In accordance with the present invention, the leads 11 are bent downwardly and inwardly to provide the foot portions 12a. Each of the leads 11 also has a laterally outwardly extending portion 12 disposed generally adjacent to, and preferably slightly above the plane of, the upper surface of the chip 14, to facilitate convenient connection of the wires 15 to the chip bonding pads 14a. In accordance with the first preferred embodiment of the present invention, each of the leads 11 is also provided with an upwardly and outwardly extending portion 17, for purposes which will become apparent hereinafter.

With continuing reference to FIGS. 2 and 3, it can be seen that the chip 14, the wires 15, and the insulating tape 13 are fully encapsulated within a molded resin or plastic body 16. Further, it can be seen that the leads 11 are partially encapsulated within the molded plastic body 16. More particularly, the laterally outwardly extending portions 12, and the portions 12b depending downwardly therefrom are fully encapsulated within the molded plastic body 16, and the upwardly and outwardly directed portions 17 and the foot portions 12a are disposed externally of the molded plastic body 16.

With particular reference now to FIG. 2, in a first mounting configuration, the semiconductor package 19 can be mounted to the upper surface of a printed circuit board (PCB) 18 by means of the foot portions 12a of the leads 11 being attached thereto, e.g., by means of brazing or soldering. Alternatively, with particular reference now to FIG. 3, the package 19 can be inverted and the package 19 mounted to the upper surface of the PCB 18 by means of the upwardly and outwardly directed portions 17 of the leads 11 being attached thereto, e.g., by means of brazing or soldering. Thus, with the first preferred embodiment of the present invention, the package 19 has the versatility to be mounted to the PCB 18 in either of the two above-described ways, depending upon the requirements of a particular application.

Figure 4:
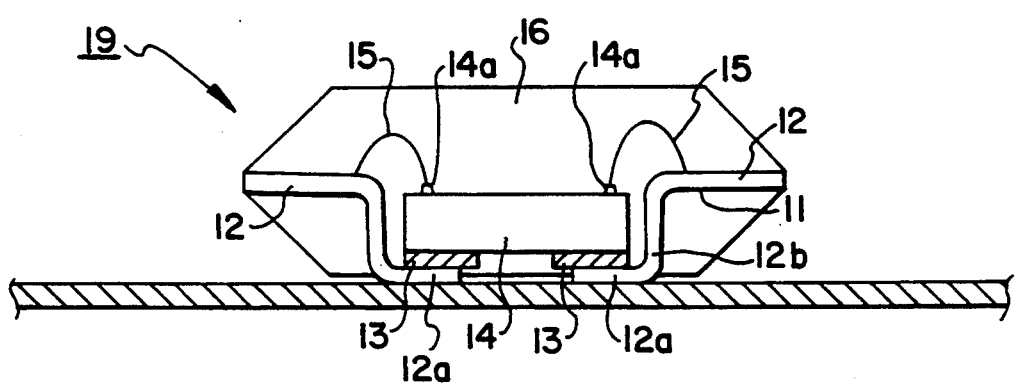
FIG. 4 is a cross-sectional view of a surface mount semiconductor package constituting a second preferred embodiment of the present invention.

With particular reference now to FIG. 4, in accordance with a second preferred embodiment of the present invention, the upwardly and outwardly extending portion 17 of the leads 11 are eliminated, thereby substantially reducing the mounting area required for mounting the package 19 to the PCB 18, and thus, substantially increasing the packing density of these components on the PCB. More particularly, the mounting area required is no greater than the outline of the molded plastic body 16, due to the fact that the leads 11 do not have any external portion which extends laterally outwardly beyond the periphery of the plastic body 16. Thus, the present invention overcomes the limitations of the presently available semiconductor packages.

Although the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A semiconductor package, including:
   a plurality of electrical leads each having a laterally outwardly extending portion, a downwardly extending portion depending from an inner distal end of said laterally outwardly extending portion, and a foot portion extending laterally inwardly from a lower distal end of said downwardly extending portion;
   a semiconductor chip mounted on said foot portion of said leads;
   a plurality of electrical wires connected between said chip to said leads;
   a protective body encapsulating said chip, said wires, and said laterally outwardly and downwardly extending portions of each of said leads; and,
   wherein said foot portion of each of said leads is at least partially disposed externally to said body for facilitating securement of said package to a substrate.

2. The package as set forth in claim 1, wherein said protective body comprises a molded plastic body.

3. The package as set forth in claim 2, wherein said foot portion of each of said leads terminates at a central portion of said body.

4. The package as set forth in claim 3, further including means for adhesively securing said chip to said foot portion of said leads.

5. The package as set forth in claim 4, wherein said adhesively securing means comprises insulating tape.

6. The package as set forth in claim 1, further including means for adhesively securing said chip to said foot portion of said leads.

7. The package as set forth in claim 1, further including insulating tape interposed between said chip and said foot portion of said leads for securing said chip to said foot portion of said leads.

8. The package as set forth in claim 6, wherein each of said leads further has an alternative mounting portion extending upwardly and outwardly from an outer distal end of said laterally outwardly extending portion, said alternative mounting portion being at least partially disposed externally to said body for facilitating securement of said package to a substrate.

9. The package as set forth in claim 8, wherein said substrate comprises a printed circuit board.

10. The package as set forth in claim 4, wherein said substrate comprises a printed circuit board.

11. The package as set forth in claim 6, wherein said laterally outwardly extending portion of each of said leads is disposed generally adjacent to an upper surface of said chip having a circuit pattern formed therein.

12. The package as set forth in claim 11, wherein said laterally outwardly extending portion of each of said leads is disposed in a first plane slightly above a second plane in which said upper surface of said chip lies.

13. The package as set forth in claim 11, further including a plurality of chip bonding pads formed on said upper surface of said chip, and wherein said wires have a first distal end secured to respective ones of said chip bonding pads and a second distal end secured to respective ones of said laterally outwardly extending lead portions.

14. The package as set forth in claim 4, wherein said plurality of leads includes a first row of leads arranged along a first edge of said chip and a second row of leads arranged along a second edge of said chip opposite said first edge.

15. The package as set forth in claim 4, wherein said foot portion of each of said leads includes an upper portion encapsulated by said molded plastic body and a lower portion disposed externally of said body, and wherein further, said adhesively securing means is interposed between said a bottom surface of said chip and said upper portion of said foot portion of said leads.

16. The package as set forth in claim 1, wherein said foot portion of each of said leads includes an upper portion encapsulated by said protective body and a lower portion disposed externally of said body for facilitating securement of said package to a substrate.

17. The package as set forth in claim 16, further including means for adhesively securing said chip to said upper portion of said foot portion of said leads.

18. The package as set forth in claim 7, wherein said foot portion of each of said leads includes an upper portion encapsulated by said protective body and a lower portion disposed externally of said body for facilitating securement of said package to a substrate, and wherein further, said insulating tape is interposed between a lower surface of said chip and said upper portion of said foot portion of said leads.

19. The package as set forth in claim 6, wherein said foot portion of each of said leads includes an upper portion encapsulated by said protective body and a lower portion disposed externally of said body for facilitating securement of said package to a substrate, and wherein further, said adhesively securing means is interposed between a lower surface of said chip opposite said upper surface, and said upper portion of said foot portion of said leads.

20. The package as set forth in claim 19, wherein said foot portion of each of said leads terminates at a central portion of said body.

21. A semiconductor package, comprising:
a semiconductor chip;
a plurality of electrical leads each having a foot portion;
a plurality of electrical wires connected between said chip and said leads;
means for securing said chip to a first major surface of said foot portion of said leads; and,
a protective body encapsulating said chip, said wires, said securing means, and a substantial portion of said leads, but leaving at least a second major surface of said foot portion of said leads opposite said first major surface exposed, to thereby facilitate electrical connection of said package to a substrate.

22. The semiconductor package as set forth in claim 21, wherein said securing means comprises an adhesive layer.

23. The semiconductor package as set forth in claim 21, wherein said securing means comprises insulating tape.

24. The semiconductor package as set forth in claim 21, wherein said protective body comprises a molded plastic body.

25. The semiconductor package as set forth in claim 24, wherein each of the said plurality of leads includes a laterally outwardly extending portion, a downwardly extending portion depending from an inner distal end of said laterally outwardly extending portion, and said foot portion extending laterally inwardly from a lower distal end of said downwardly extending portion.

26. The semiconductor package as set forth in claim 25, wherein each of said plurality of leads further includes an alternative mounting portion extending outwardly beyond the confines of said protective body for facilitating electrical connection of said package to a substrate.

27. The semiconductor package as set forth in claim 21, wherein said substrate comprises a printed circuit board.

28. The semiconductor package as set forth in claim 21, wherein said foot portion of each of said leads includes a first portion encapsulated by said protective body and a lower portion disposed externally of said protective body.

29. A semiconductor package, comprising:
a semiconductor chip;
a plurality of electrical leads, each of said leads having a laterally outwardly extending portion, a downwardly extending portion depending from an inner distal end of said laterally outwardly extending portion, and a foot portion extending laterally inwardly from a lower distal end of said downwardly extending portion;
a plurality of electrical wires connected between an active surface of said chip and respective ones of said leads;
an electrically insulating layer securing an inactive surface of said chip opposite said active surface to said foot portion of said leads; and,
a package body encapsulating said chip, said wires, said electrically insulating layer, and said laterally outwardly extending and downwardly extending portions of said leads, leaving at least a contact surface portion of said foot portion of said leads exposed, to thereby facilitate electrical connection of said package to a substrate, with said package being disposed in a parallel orientation with respect to said substrate.

30. The package as set forth in claim 29, wherein said electrically insulating layer is made of an adhesive material.

31. The package as set forth in claim 29, wherein said package body comprises a molded plastic body.

32. The package as set forth in claim 29, wherein each of said leads further includes an alternative mounting portion extending from an outer distal end of said laterally outwardly extending portion to the outside of said package body, for facilitating electrical connection of said package to said substrate.

33. The package as set forth in claim 29, wherein said substrate comprises a printed circuit board.

34. The package as set forth in claim 29, wherein an upper portion of said foot portion of each of said leads is encapsulated by said package body, and a lower portion of said foot portion of each of said leads is disposed externally of said package body.

35. The package as set forth in claim 29, wherein said foot portion of each of said leads extends beneath said inactive surface of said semiconductor chip.

36. A semiconductor package, comprising:
a semiconductor chip;
a plurality of electrical leads, each of said leads having a laterally outwardly extending portion, an upwardly extending portion depending from an inner distal end of said laterally outwardly extending portion, and a foot portion extending laterally inwardly from an upper distal end of said upwardly extending portion;
a plurality of electrical wires connected between an active surface of said chip and respective ones of said leads;
an electrically insulating layer securing an inactive surface of said chip opposite said active surface to said foot portion of said leads; and,
a package body encapsulating said chip, said wires, said electrically insulating layer, and said laterally outwardly extending and upwardly extending portions of said leads, leaving at least a contact surface portion of said foot portion of said leads exposed, to thereby facilitate electrical connection of said package to a substrate, with said package being disposed in a parallel orientation with respect to said substrate.

37. The package as set forth in claim 36, wherein said electrically insulating layer is made of an adhesive material.

38. The package as set forth in claim 36, wherein said package body comprises a molded plastic body.

39. The package as set forth in claim 36, wherein each of said leads further includes an alternative mounting portion extending from an outer distal end of said laterally outwardly extending portion to the outside of said package body, for facilitating electrical connection of said package to said substrate.

40. The package as set forth in claim 36, wherein said substrate comprises a printed circuit board.

41. The package as set forth in claim 36, wherein a lower portion of said foot portion of each of said leads is encapsulated by said package body, and an upper portion of said foot portion of each of said leads is disposed externally of said package body.

42. The package as set forth in claim 36, wherein said foot portion of each of said leads extends above said inactive surface of said semiconductor chip.

* * * * *